US010971389B2

(12) United States Patent
Lin et al.

(10) Patent No.: US 10,971,389 B2
(45) Date of Patent: *Apr. 6, 2021

(54) MULTI-ZONE PEDESTAL FOR PLASMA PROCESSING

(71) Applicant: Applied Materials, Inc., Santa Clara, CA (US)

(72) Inventors: Xing Lin, San Jose, CA (US); Bozhi Yang, Santa Clara, CA (US); Jianhua Zhou, Campbell, CA (US); Dale R. Dubois, Los Gatos, CA (US); Juan Carlos Rocha-Alvarez, San Carlos, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 250 days.

This patent is subject to a terminal disclaimer.

(21) Appl. No.: 16/148,639

(22) Filed: Oct. 1, 2018

(65) Prior Publication Data

US 2019/0035665 A1 Jan. 31, 2019

Related U.S. Application Data

(63) Continuation of application No. 15/608,472, filed on May 30, 2017, now Pat. No. 10,090,187, which is a (Continued)

(51) Int. Cl.
*H01L 21/687* (2006.01)
*C23C 16/458* (2006.01)
(Continued)

(52) U.S. Cl.
CPC ........ *H01L 21/687* (2013.01); *C23C 16/4586* (2013.01); *C23C 16/50* (2013.01);
(Continued)

(58) Field of Classification Search
CPC ............. H01L 21/687; H01L 21/67103; H01L 21/67109; H01L 21/68792;
(Continued)

(56) References Cited

U.S. PATENT DOCUMENTS 3,184,370 A 5/1965 Luks
6,376,808 B2 4/2002 Tachikawa et al.
(Continued)

FOREIGN PATENT DOCUMENTS

CN 2786784 Y 6/2006
JP 2004200619 A 7/2004
TW 201222696 A 6/2012

OTHER PUBLICATIONS

Taiwan Office Action dated Nov. 16, 2018 for Application No. 104118634.
(Continued)

*Primary Examiner* — Shawntina T Fuqua
(74) *Attorney, Agent, or Firm* — Patterson + Sheridan LLP

(57) ABSTRACT

A method and apparatus for a heated pedestal is provided. In one embodiment, the heated pedestal includes a body comprising a ceramic material, a plurality of heating elements encapsulated within the body, and one or more grooves formed in a surface of the body adjacent each of the plurality of heating elements, at least one side of the grooves being bounded by a ceramic plate.

22 Claims, 6 Drawing Sheets

Related U.S. Application Data continuation of application No. 14/738,610, filed on Jun. 12, 2015, now Pat. No. 9,725,806.

(60) Provisional application No. 62/020,186, filed on Jul. 2, 2014.

(51) Int. Cl.
*H01J 37/32* (2006.01)
*H01L 21/67* (2006.01)
*C23C 16/50* (2006.01)

(52) U.S. Cl.
CPC .. *H01J 37/32577* (2013.01); *H01J 37/32724* (2013.01); *H01L 21/67103* (2013.01); *H01L 21/67109* (2013.01); *H01L 21/68792* (2013.01)

(58) Field of Classification Search
CPC ............... H01L 21/67106; C23C 16/50; C23C 16/4586; H01J 37/32577; H01J 37/32724
See application file for complete search history.

(56) References Cited

U.S. PATENT DOCUMENTS

| | | |
|---|---|---|
| 6,914,222 B2 | 7/2005 | Nakamura |
| 7,907,384 B2 | 3/2011 | Brown et al. |
| 8,790,007 B2 | 7/2014 | Goto |
| 9,725,806 B2 | 8/2017 | Lin et al. |
| 10,090,187 B2 | 10/2018 | Lin et al. |
| 2001/0042744 A1 | 11/2001 | Tachikawa et al. |
| 2012/0018416 A1* | 1/2012 | Goto ............... H01L 21/68792 219/481 |
| 2012/0211933 A1* | 8/2012 | Goto ............... H01L 21/67248 269/293 |
| 2015/0332942 A1* | 11/2015 | Peh ................ H01L 21/67248 165/253 |

OTHER PUBLICATIONS

TW Notice of Allowance in related application TW 108104680 dated May 20, 2019.

* cited by examiner

MULTI-ZONE PEDESTAL FOR PLASMA PROCESSING

CROSS-REFERENCE TO RELATED APPLICATIONS

This application is a continuation of U.S. patent application Ser. No. 15/608,472, filed May 30, 2017, which is a continuation of U.S. patent application Ser. No. 14/738,610, filed Jun. 12, 2015, which application claims benefit of U.S. Provisional Patent Application Ser. No. 62/020,186, filed Jul. 2, 2014, which are all hereby incorporated by reference herein.

BACKGROUND

Field

Embodiments disclosed herein generally relate to a semiconductor processing chamber and, more specifically, a heated support pedestal for a semiconductor processing chamber having multi-zone temperature control.

Description of the Related Art

Semiconductor processing involves a number of different chemical and physical processes enabling minute integrated circuits to be created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support or pedestal disposed therein to support the substrate during processing. In some processes, the pedestal may include an embedded heater adapted to control the temperature of the substrate and/or provide elevated temperatures that may be used in the process. Conventionally, the pedestals may be made of a ceramic material, which generally provide desirable device fabrication results.

However, ceramic pedestals create numerous challenges. One of these challenges is multiple zone heating and/or accurate temperature control of one or more of the zones. In addition, ceramic materials may not be readily machinable as compared to other materials, such as aluminum, and creates a manufacturing challenge for the forming of grooves therein for electrical leads and/or for embedded temperature sensing devices.

Therefore, what is needed is a pedestal that is temperature-controlled in multiple zones.

SUMMARY

A method and apparatus of a heated pedestal is provided. In one embodiment, the heated pedestal includes a body comprising a body comprising a ceramic material, wherein one or more grooves are formed in one or more surfaces of the body, a ceramic plate bounding least one side of the grooves, and a plurality of heating elements encapsulated within the body.

In another embodiment, a pedestal for a semiconductor processing chamber is provided. The pedestal includes a body comprising a ceramic material, wherein one or more grooves are formed a major surface of the body, a ceramic plate coupled to the major surface and bounding at least one side of the grooves, a plurality of heating elements encapsulated within the body, a hollow shaft comprising a ceramic material coupled to the body, and a dielectric insert having a plurality of channels formed therein disposed in the hollow shaft.

In another embodiment, a pedestal for a semiconductor processing chamber is provided. The pedestal includes a body comprising a ceramic material, wherein one or more grooves are formed a major surface of the body, a ceramic plate coupled to the major surface and bounding at least one side of the grooves, a plurality of heating elements encapsulated within the body, a hollow shaft comprising a ceramic material coupled to the body, and a dielectric insert having a plurality of channels formed therein disposed in the hollow shaft, wherein at least a portion of the channels in the dielectric insert comprise a curved portion having an end terminating at an end of at least one of the grooves formed in the body.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the embodiments disclosed herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure are illustratively described below in reference to plasma chambers, although embodiments described herein may be utilized in other chamber types and in multiple processes. In one embodiment, the plasma chamber is utilized in a plasma enhanced chemical vapor deposition (PECVD) system. Examples of PECVD systems that may be adapted to benefit from the disclosure include a PRODUCER® SE CVD system, a PRODUCER® GT™ CVD system or a DXZ® CVD system, all of which are commercially available from Applied Materials, Inc., Santa Clara, Calif. The Producer® SE CVD system chamber (e.g., 200 mm or 300 mm) has two isolated processing regions that may be used to deposit thin films on substrates, such as conductive films, oxide films such as silicon oxide films, carbon-doped silicon oxides and other materials. Although the exemplary embodiment includes two processing regions, it is contemplated that embodiments disclosed herein may be used to advantage in systems having a single processing region or more than two processing regions. It is also contemplated that embodiments disclosed herein may be utilized to advantage in other plasma chambers, including etch chambers, ion implantation chambers, plasma treatment chambers, and in resist stripping chambers, among others. It is further contemplated that embodiments disclosed herein may be utilized to advantage in plasma processing chambers available from other manufacturers.

Figure 1:
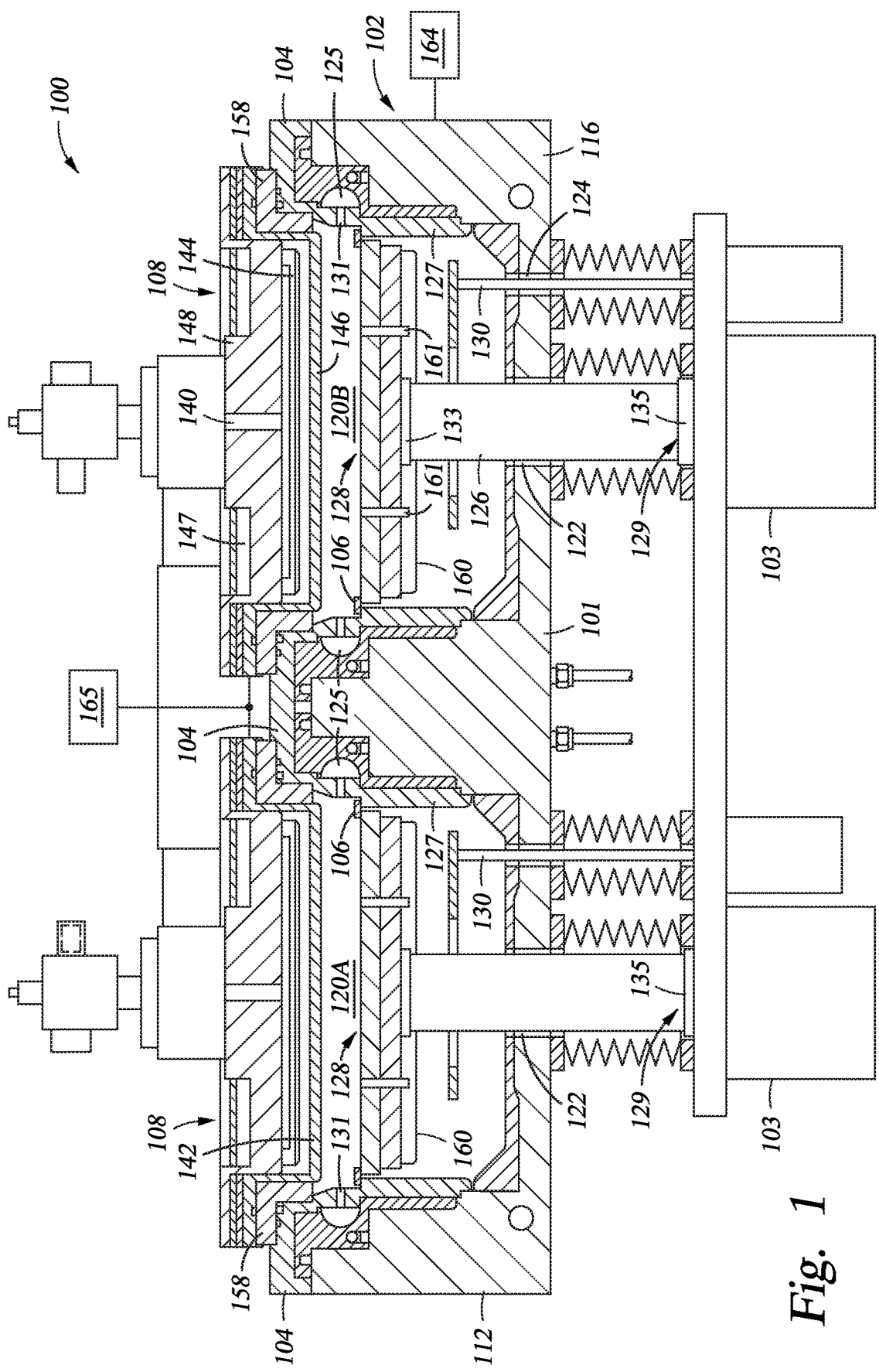
FIG. 1 is a partial cross sectional view of one embodiment of a plasma system.

FIG. 1 is a partial cross sectional view of a plasma system 100. The plasma system 100 generally comprises a processing chamber body 102 having sidewalls 112, a bottom wall 116 and a shared interior sidewall 101 defining a pair of processing regions 120A and 120B. Each of the processing regions 120A-B is similarly configured, and for the sake of brevity, only components in the processing region 120B will be described.

A pedestal 128 is disposed in the processing region 120B through a passage 122 formed in the bottom wall 116 in the system 100. The pedestal 128 provides a heater adapted to support a substrate (not shown) on the upper surface thereof. The pedestal 128 may include heating elements, for example resistive heating elements, to heat and control the substrate temperature at a desired process temperature. Alternatively, the pedestal 128 may be heated by a remote heating element, such as a lamp assembly.

The pedestal 128 is coupled by a flange 133 to a stem 126. The stem 126 couples the pedestal 128 to a power outlet or power box 103. The power box 103 may include a drive system that controls the elevation and movement of the pedestal 128 within the processing region 120B. The stem 126 also contains electrical power interfaces to provide electrical power to the pedestal 128. The power box also 103 also includes interfaces for electrical power and temperature indicators, such as a thermocouple interface. The stem 126 also includes a base assembly 129 adapted to detachably couple to the power box 103 thereto. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 of the processing region 120B and is utilized to position substrate lift pins 161 disposed through the pedestal 128. The substrate lift pins 161 selectively space the substrate from the pedestal to facilitate exchange of the substrate with a robot (not shown) utilized for transferring the substrate into and out of the processing region 120B through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146. A radio frequency (RF) source 165 is coupled to the showerhead assembly 142. The RF source 165 powers the showerhead assembly 142 to facilitate generation of a plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120B in very close proximity to the sidewalls 101, 112 of the chamber body 102 to prevent exposure of the sidewalls 101, 112 to the processing environment within the processing region 120B. The liner assembly 127 includes a circumferential pumping cavity 125 that is coupled to a pumping system 164 configured to exhaust gases and byproducts from the processing region 120B and control the pressure within the processing region 120B. A plurality of exhaust ports 131 may be formed on the chamber liner assembly 127. The exhaust ports 131 are configured to allow the flow of gases from the processing region 120B to the circumferential pumping cavity 125 in a manner that promotes processing within the system 100.

FIGS. 2A-2D are top views of various embodiments of a pedestal that may be utilized as the pedestal 128 in the plasma system 100 of FIG. 1. Each of the pedestals shown in FIGS. 2A-2D include a plurality of zones that may be individually heated. Each of the zones may also be individually monitored for temperature metrics and adjusted, as needed, based on a desired temperature profile.

Figure 2A:
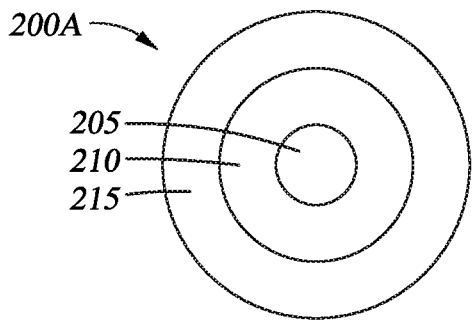
FIGS. 2A-2D are top views of various embodiments of a pedestal that may be utilized as the pedestal in the plasma system of FIG. 1.

FIG. 2A shows the top surface of a pedestal 200A having three zones, such as an inner zone 205, and intermediate zone 210 and an outer zone 215. In one embodiment, each of the zones 205, 210 and 215 are concentric. As an example, the inner zone 205 may include a radius from 0 to about 85 millimeters (mm) from the center of the pedestal. As another example, the intermediate zone 210 may include an inside radius substantially the same as the radius of the outer perimeter of the inner zone 205 to a radius of about 123 mm. As another example, the outer zone 215 may include an inside radius substantially the same as the radius of the outer perimeter of the intermediate zone 210 to a radius of about 150 mm or greater, such as about 170 mm, for example, about 165 mm.

Figure 2B:
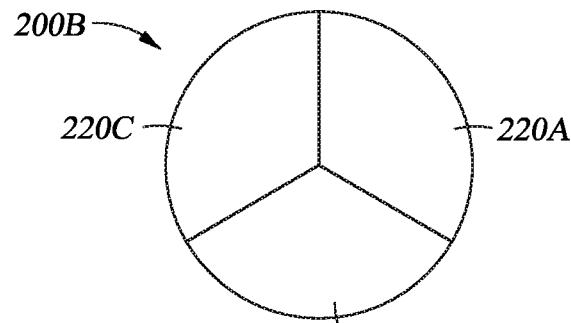

FIG. 2B shows a pedestal 200B wherein a plurality of zones 220A-220O extend in sections around the pedestal in a pie shape. Each zone 220A, 220B and 220C may be heated similarly or differently depending on desired processing conditions. While the pedestal 200B includes three zones, the number of zones may be greater or less than three.

Figure 2C:
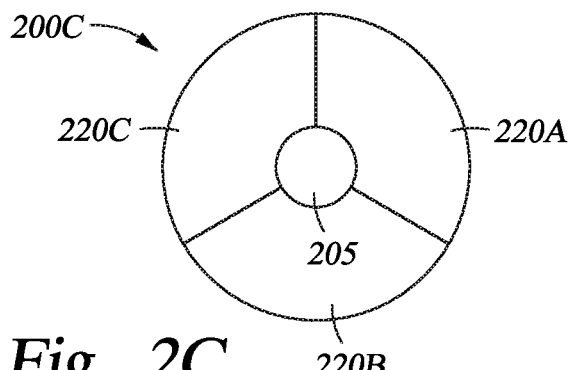

FIG. 2C shows a pedestal 200C wherein a plurality of zones 220A-220C are provided in a pie shape, similar to the pedestal 200B shown in FIG. 2B. However, the pedestal 200C also includes an inner zone 205 similar to the pedestal 200A shown in FIG. 2A. The inner zone 205 may extend from a center of the pedestal 200C to a radius of about 50 mm or greater, such as between about 80 mm to about 90 mm.

Figure 2D:
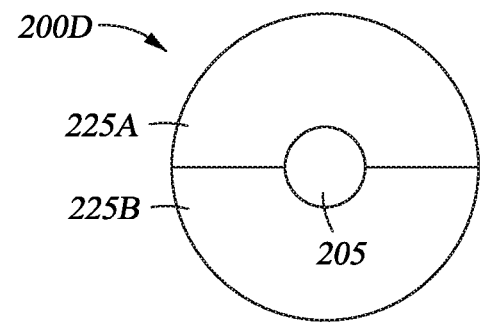

FIG. 2D shows a pedestal 200D wherein a plurality of outer zones 225A and 225B surround an inner zone 205. In one embodiment, each of the plurality of outer zones 225A and 225B are arc-shaped. In some embodiments, each of the plurality of outer zones 225A and 225B are shaped substantially as a semicircle. The inner zone 205 may extend from a center of the pedestal 200C to a radius of about 50 mm or greater, such as between about 80 mm to about 90 mm.

Figure 3:
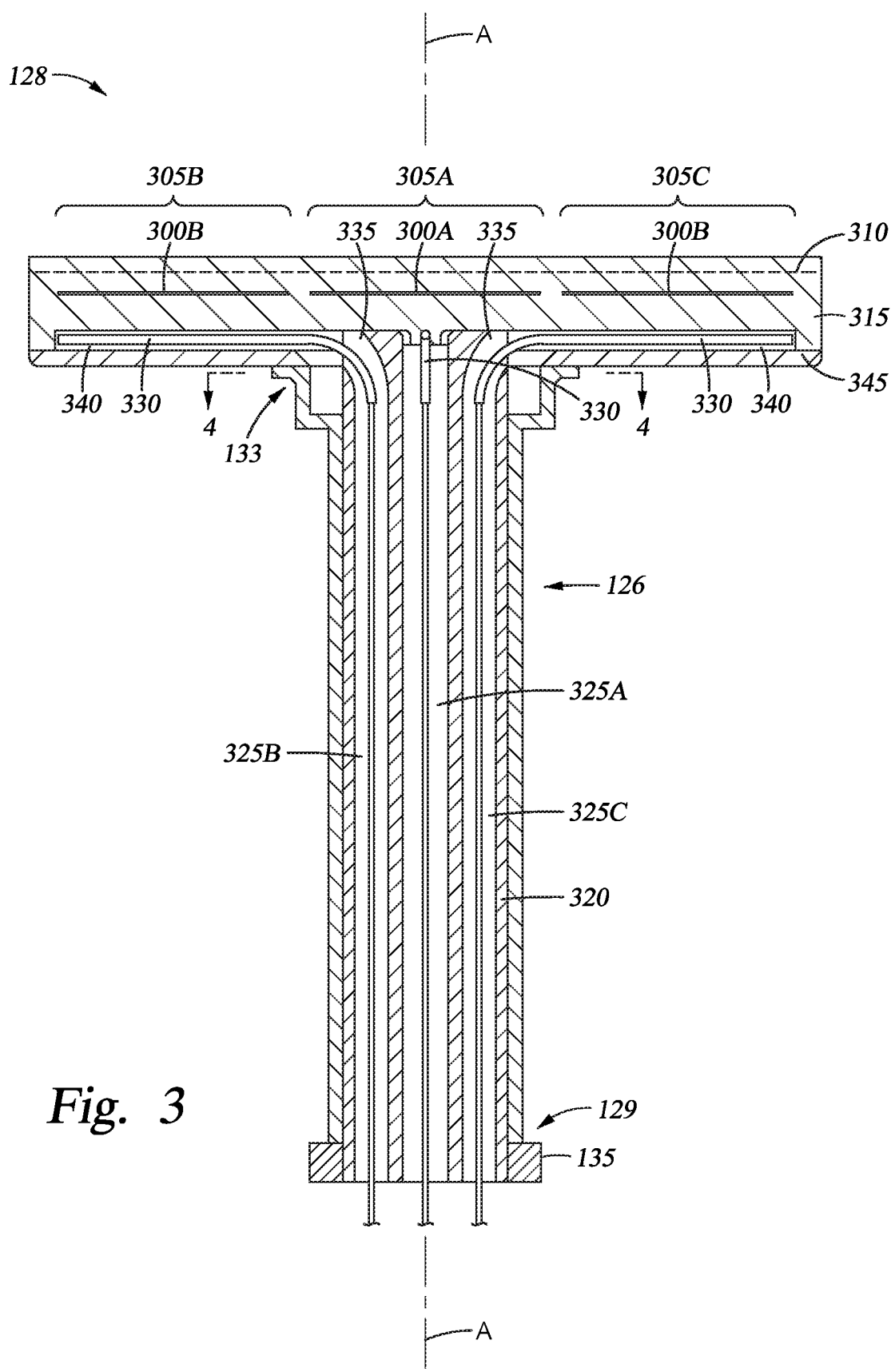
FIG. 3 is a cross-sectional view of another embodiment of a pedestal that may be used in the plasma system of FIG. 1.

FIG. 3 is a cross-sectional view of one embodiment of a pedestal 128 that may be used in the plasma system 100 of FIG. 1. The pedestal 128 includes the stem 126 that is configured as a tubular member or hollow shaft. The stem 126 couples to the pedestal 128 by a flange 133.

The pedestal 128 comprises a multi-zone heater having a central heater 300A and one or more outer heaters shown as 300B. The central heater 300A and the outer heaters 300B may be utilized to provide multiple, independently controlled heating zones on the pedestal 128. For example, the pedestal 128 may include a central zone configured as a first heating zone 305A and one or more outer zones shown as 305B and 305C, which may be similar to the pedestal 200C shown in FIG. 2C. The pedestal 128 may also include an electrode 310 therein for use in plasma generation in the adjacent processing region. The electrode 310 may be a conductive plate or a mesh material that is embedded in a first portion 315 that forms a body of the pedestal 128. Likewise, each of the central heater 300A and the outer heaters 300B may be a wire or other electrical conductor embedded in the first portion 315 of the pedestal 128.

Electrical leads, such as wires, for the central heater 300A and the outer heaters 300B, as well as the electrode 310, may be provided through the stem 126. A dielectric insert 320 may be used to separate the electrical leads within the stem 126. For example, the dielectric insert 320 may be made of a ceramic material and include channels therein extending along a longitudinal axis A of the pedestal 128. Additionally, temperature monitoring devices 330, such as flexible thermocouples, may be routed through the dielectric insert 320 to monitor various zones of the pedestal 128. In FIG. 3, temperature monitoring devices 330 are shown in channels 325A-325C. Other channels not shown in the cross-sectional view of FIG. 3 may contain electrical leads for connection to the central heater 300A and the outer heaters 300B, as well as to the electrode 310.

At least a portion of the channels 325A-325C within the dielectric insert 320 include a radially outwardly curved guide portion 335, shown at an end of the channels 325B and 325C proximate to, and ending at, the pedestal 128. The guide portion 335 allows the temperature monitoring devices 330 to be inserted from the dielectric insert 320 and into a groove 340 formed in a side of the first portion 315 of the pedestal 128. At least one side of the groove 340 is bounded by a second portion 345 in the form of a plate that is coupled to the first portion 315 of the pedestal 128. Thus, the channels 325A-325C provide for insertion of the temperature monitoring devices 330 from the base assembly 129 and provide a guide through the stem 126 and into the respective grooves 330 of the pedestal 128. This provides easy replacement of temperature monitoring devices 330 as well as adjustment of measurement locations of the temperature monitoring devices 330 within the pedestal 128.

Figure 4A:
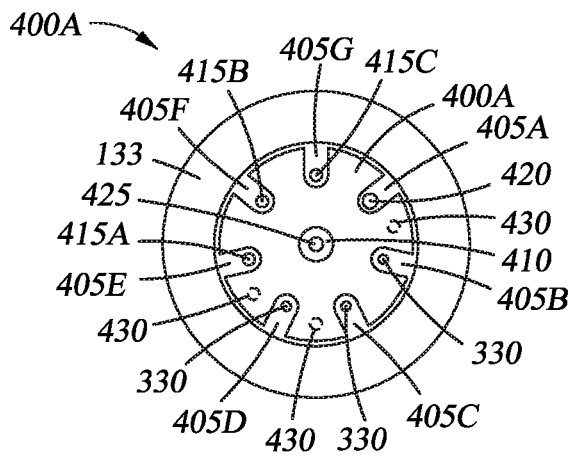
FIGS. 4A-4C are plan views of the pedestal taken along section line 4-4 in FIG. 3 showing various embodiments of a dielectric insert thereof.
Figure 4B:
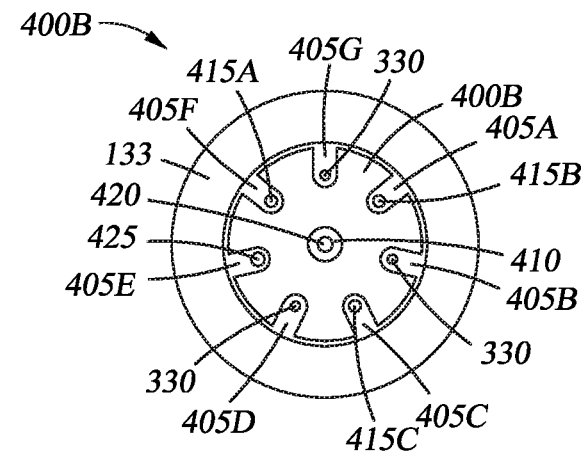
Figure 4C:
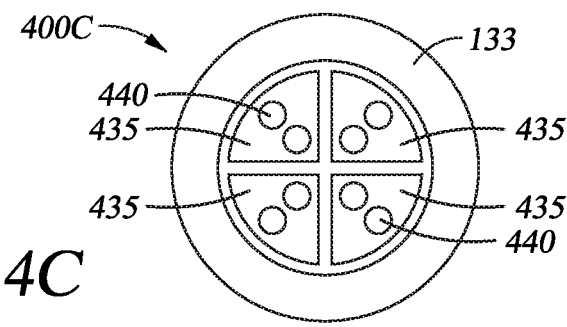

FIGS. 4A-4C are plan views of the pedestal 128 taken along section line 4-4 in FIG. 3 showing various embodiments of a dielectric insert. The dielectric inserts shown in FIGS. 4A-4C may be used in the pedestal 128 of FIG. 3.

FIG. 4A shows a plan (end) view of a specific dielectric insert 400A having a plurality of channels 405A-405G formed in a u-shape extending therein from an outer surface thereof. The channels 405A-405G extend the entire length of the dielectric insert 400A. The dielectric insert 400A also includes a central channel 410 extending therethrough in the length direction thereof. At least a portion of the channels 405A-405G and 410 include an electrical lead or terminal to provide electrical communication between a power source(s) (not shown) and the central heater 300A, the outer heaters 300B, and well as the electrode 310. For example, for a three zone heated pedestal for use in a plasma process, electrical terminals 415A-415C, disposed in channels 405E-405G, respectively, may be provided by the dielectric insert 400A. The electrical terminals 415A-4150 may provide power to the central heater 300A and the outer heaters 300B shown in FIG. 3. A RF return terminal 420 may be disposed in channel 405A. The RF return terminal 420 may provide an electrical path from the electrode 310 (shown in FIG. 3) to ground, or alternatively provide RF bias to the electrode 310 when a separate RF tuning device is utilized. A terminal 425 may be disposed in the central channel 410. The terminal 425 may be a common return or a ground for the electrical terminals 415A-4150. The terminals 415A-4150 may be configured for alternating current (AC) power or direct current (DC) power. Lastly, the temperature monitoring devices 330 may be disposed in the channels 405B-405D. In some embodiments, positions of the terminal 425 and the RF return terminal 420 may be switched. An advantage of this design may be enhanced RF uniformity (i.e., a more uniform RF field due to the placement at the center) and thermal energy may be more evenly distributed. Additional holes 430, shown in phantom in FIG. 4A, may be added, if needed, for additional terminals and/or temperature monitoring devices.

FIG. 4B shows a dielectric insert 400B having a plurality of channels 405A-405G that is similar to the dielectric insert 400A shown in FIG. 4A. In this embodiment, the dielectric insert 400B has a circumferential symmetrical design. The RF return terminal 420 is disposed in the central channel 410 and the electrical terminals 415A-415C alternate with the temperature monitoring devices 330. The terminal 425, which may be a common return or a ground for the electrical terminals 415A-415C, is disposed in an exterior channel, such as channel 405E.

The monolithic dielectric insert 400A or 400B is used to electrically insulate the terminals from each other. While not shown, one of more of the channels 405A-405G may be a hole similar to the central channel 410. The number of channels (i.e., slots or holes) may be varied depending on the number of desired zones in the pedestal 128. When one or more of the terminals include a small cross-section and/or has a low electrical insulation requirement, multiple terminals may be provided in a single channel. In the embodiments shown in FIGS. 4A and 4B, the channels 405A-405G are evenly distributed at a substantially equal radial location. However, the channels 405A-405G may be distributed in a non-uniform manner, at different angles, as well as different radial positions.

FIG. 4C shows a dielectric insert 400C comprising a plurality of dielectric sections 435. Each of the dielectric sections 435 may include holes 440 for electrical terminals and temperature monitoring devices (not shown) similar to the electrical terminals 415A-415C, the RF return terminal 420 and the terminal 425 shown in FIGS. 4A and 4B. Each of the dielectric sections 435 may have the same or a different cross-section or shape. One or more of the dielectric sections 435 may include alignment features to facilitate indexing and/or coupling between adjacent dielectric sections 435 and/or the sidewall of the stem 126. One or more of the dielectric sections 435 may contact each other when installed in the stem 126, or a gap may be provided therebetween.

Figure 5:
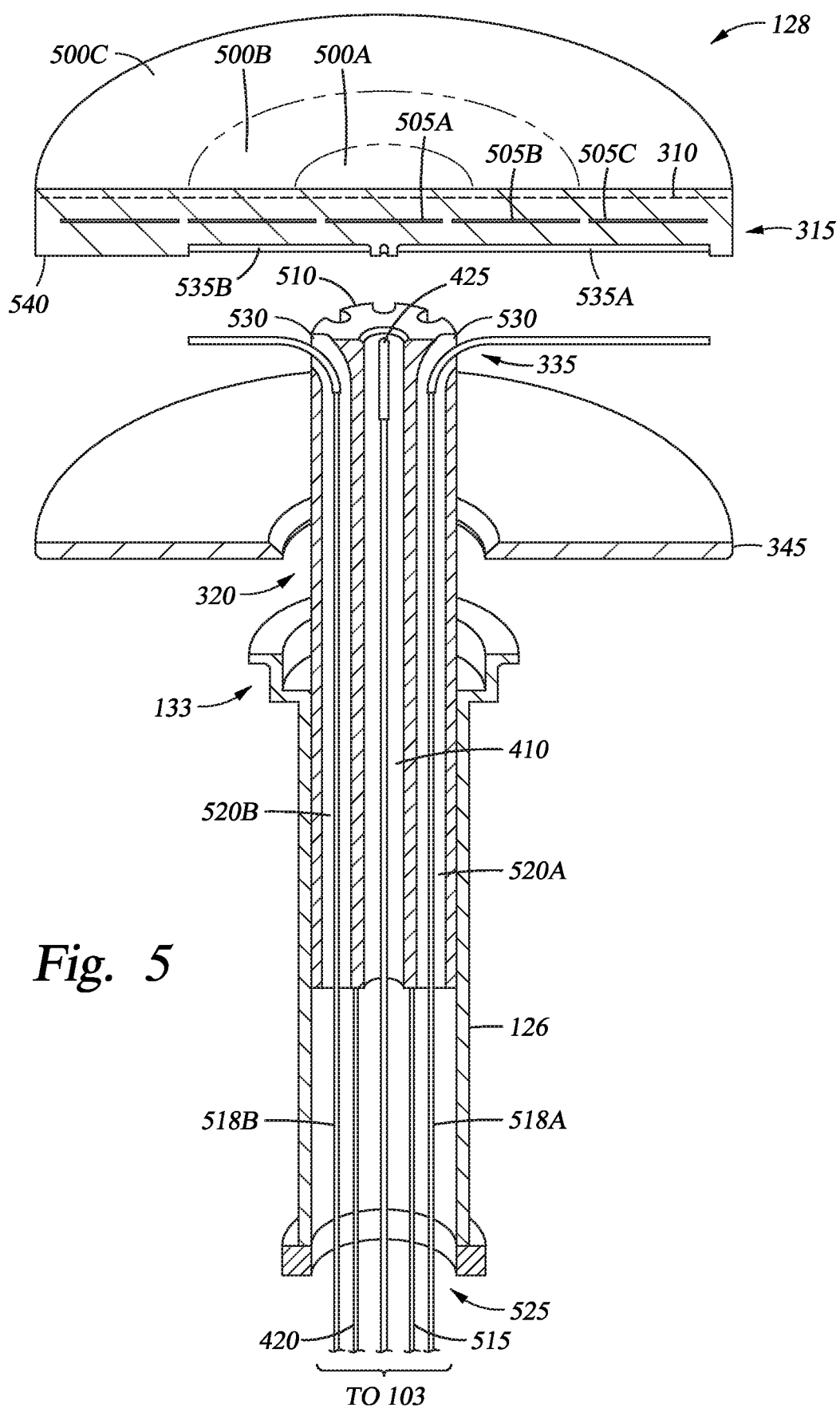
FIG. 5 is an isometric exploded cross-sectional view of one embodiment of a pedestal that may be used in the plasma system of FIG. 1.

FIG. 5 is an exploded cross-sectional view of one embodiment of a pedestal 128 that may be used in the plasma system 100 of FIG. 1. As an example, the pedestal 128 comprises a three zone heater having a central zone 500A, an intermediate zone 500B and an outer zone 500C powered by respective heating elements 505A, 505B and 505C. In one embodiment, the pedestal 128, as well as the stem 126, is made of a ceramic material.

Power for the heating elements 505A, 505B and 505C is provided through the stem 126 via a dielectric insert 320, which may be made of a ceramic material. The dielectric insert 320 includes a plurality of slots 510 extending inwardly of the outer circumferential wall thereof and over the length direction thereof, within which electrical terminals 515 for the heating elements 505A, 505B and 505C may be electrically isolated from one another. A terminal 425, which may be a common electrical return lead or a ground, is disposed in a central channel 410 of the dielectric insert 320.

Temperature monitoring devices 518A and 518B is disposed in channels 520A and 520B. The temperature monitoring devices 518A and 518B are flexible thermocouples utilized to monitor temperature of the outer zone 500C and the intermediate zone 500B, respectively, of the three zone heater. A central temperature monitoring device 525 may be provided through the dielectric insert 320 to monitor the central zone 500A. Additionally, an RF return terminal 420 may be provided through the dielectric insert 320 for the electrode 310 in the pedestal 128.

The temperature monitoring devices 518A and 518B may be inserted into a distal end of the stem 126 and routed though the dielectric insert 320 while being guided by the channels 520A and 520B. The channels 520A and 520B include a guide portion 335 comprising a curved surface 530. The curved surface 530 redirects the temperature monitoring devices 518A and 518B extended into the stem 126 into respective grooves 535A and 535B formed in a first portion 315 of the pedestal 128. The grooves 535A and 535B may be formed in a lower surface 540 of the first portion 315 of the pedestal 128. A separate groove (not shown in the cross sectional view of FIG. 5) may be provided for the central temperature monitoring device 525.

As stated above, the pedestal 128 comprises a ceramic material. The grooves 535A and 535B may be formed in the first portion 315 prior to sintering of the ceramic material. A second portion 345 of the pedestal 128, also made of a ceramic material, may then be bonded to the lower surface 540 of the first portion. The first portion 315 and the second portion 345 may be bonded together by a low-temperature/low-pressure bonding process, such as a glass-phase bonding process. As sintering temperatures may cause the grooves 535A and 535B to deform or collapse, the low-temperature/low-pressure bonding process provides for maintenance of the dimensions of the grooves 535A and 535B. The stem 126, which is also made of a ceramic material, may also be bonded to the second portion 345 by the low-temperature/low-pressure bonding process. Once bonding is completed, the dielectric insert 320 may be inserted into the inside diameter of the stem 126. Thereafter, the terminals and temperature monitoring devices may be installed in the channels of the dielectric insert.

The placement of the temperature monitoring devices 518A and 518B within the grooves 535A and 535B provides enhanced temperature measurement of the outer zone 500C and the intermediate zone 500B as compared to conventional heaters. For example, in conventional heaters, temperature monitoring of outer zones of the heater is based on monitoring of the resistance of the heating elements embedded in the heater. Temperature monitoring at low temperatures (e.g., below about 300 degrees C., utilized in some film deposition processes) is difficult using the conventional resistance coefficients of the heating elements. However, utilization of the grooves 535A and 535B and corresponding temperature monitoring devices 518A and 518B, provides more precise temperature measurement than can be provided using resistance coefficients of the heating elements. This enhanced temperature monitoring provides more accurate temperature metrics in the outer zone 500C and the intermediate zone 500B, especially at low temperatures. The temperature monitoring provided by the temperature monitoring devices 518A and 518B may also facilitate faster temperature measurement response times at high or low temperatures such that a desired temperature profile across the pedestal 128 may be realized. The desired temperature profile across the pedestal 128 provides a desired temperature profile on a substrate which increases uniformity in films deposited on the substrate.

Figure 6:
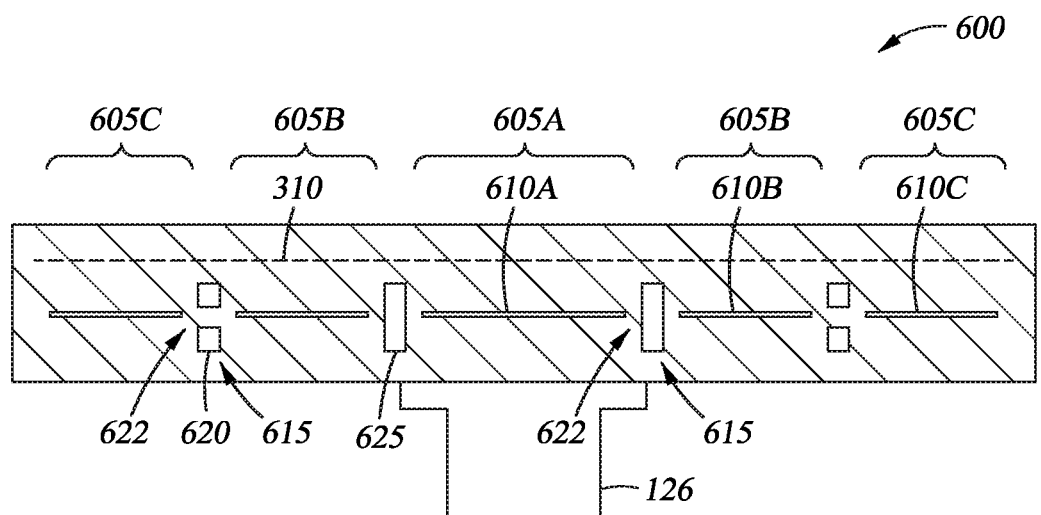
FIG. 6 is a side cross-sectional view of another embodiment of a pedestal that may be used in the plasma system of FIG. 1.

FIG. 6 is a side cross-sectional view of another embodiment of a pedestal 600 that may be used in the plasma system 100 of FIG. 1. As an example, the pedestal 600 comprises a three zone heater having a central zone 605A, an intermediate zone 605B and an outer zone 605C powered by respective heating elements 610A, 610B and 610C. In this embodiment, the zones of the pedestal 600 may be substantially thermally isolated in order to enhance tuning of each zone.

In one embodiment, each zone of the pedestal 600 may comprise materials with different thermal properties. For example, central zone 605A may comprise a ceramic material having a first thermal conductivity value while the intermediate zone 605B and/or the outer zone 605C may comprise a ceramic material having a second thermal conductivity value that is different than the first thermal conductivity value. In some embodiments, a ceramic material having a third thermal conductivity value different than the first and second thermal conductivity values may be used for one of the zones. The ceramic materials having different thermal conductivity values may be used as desired to construct the zones of the pedestal 600. In another embodiment, gaps 622 may be provided between adjacent heating elements to smooth temperature gradients between zones. The size of the gaps 622 (i.e., distance between heating elements) may be chosen based on a desired thermal homogenization between zones.

In another embodiment, thermal breaks 615 may be used between heating elements 610A and 610B, and 610B and 610C. The thermal breaks 615 extend circumferentially and are utilized to reduce thermal conduction from one zone to an adjacent zone. The thermal breaks 615 may comprise one or more cavities 620 formed in the body of the pedestal 600, or one or more barriers 625. The cavities 620 may be a simple space or void in the ceramic material and the barriers 625 may be aluminum oxide or other material that is different than the material of the remainder of the pedestal 600. While the thermal breaks 615 are shown in between heating elements, the thermal breaks 615 may be positioned in other locations in the pedestal 600.

Figure 7:
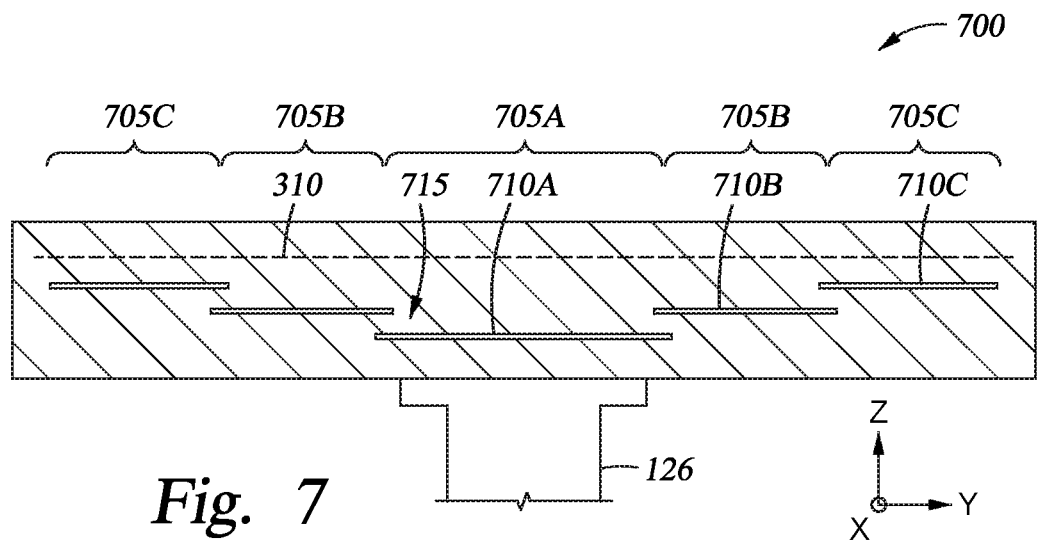
FIG. 7 is a side cross-sectional view of another embodiment of a pedestal that may be used in the plasma system of FIG. 1.

FIG. 7 is a side cross-sectional view of another embodiment of a pedestal 700 that may be used in the plasma system 100 of FIG. 1. As an example, the pedestal 700 comprises a three zone heater having a central zone 705A, an intermediate zone 705B and an outer zone 705C powered by respective heating elements 710A, 710B and 710C. In this embodiment, the heating elements may at least partially overlap and/or be positioned at different elevations within the pedestal 700. The positioning of the heating elements within the pedestal 700 allows more design flexibility, such as variations in heating element size and/or shape. Gaps 715 may also be utilized in one or both of the vertical spacing (Z direction) between adjacent heating elements, and lateral spacing (Y direction) between adjacent heating elements similar to the gaps 622 shown in FIG. 6. Additionally, the elevations of the heating elements may be different than the configuration shown in FIG. 7. For example, the heating element 710A may be positioned above one or both of the heating elements 710B and 710C. In another example, the heating element 710A may be coplanar with either the heating element 710B or 710C.

Figure 8A:
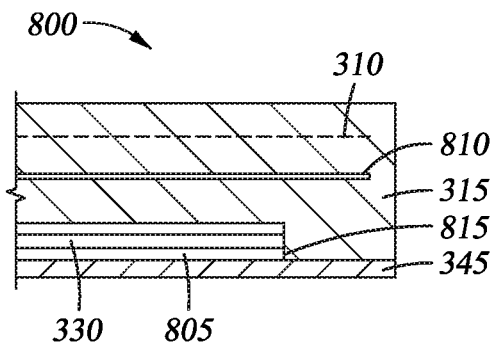
FIGS. 8A and 8B are side cross-sectional view showing a portion of another embodiment of a pedestal that may be used in the plasma system of FIG. 1.
Figure 8B:
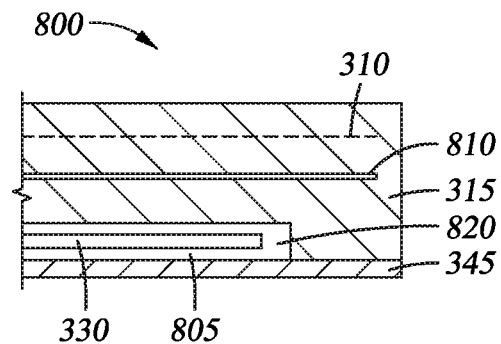

FIGS. 8A and 8B are side cross-sectional view showing a portion of another embodiment of a pedestal 800 that may be used in the plasma system 100 of FIG. 1. The pedestal 800 includes a heating element 810 that may be similar to the outer heating elements 300B described in FIG. 3 or heating element 505C described in FIG. 5. The pedestals 800 also include a groove 805 that may be similar to the groove 340 described in FIG. 3 or the groove 535A and/or 535B described in FIG. 5. The embodiments of the pedestals as described herein include the grooves 805, which provide flexibility in temperature monitoring as well as enhancing temperature monitoring of the pedestals.

In one embodiment, shown in FIG. 8A, the temperature monitoring device 330 is positioned into the groove 805 (from the distal end of the stem 126 (shown in FIGS. 3 and 5)) and placed in contact with the outer wall 815 of the groove 805. Advantages of contact between a wall and the temperature monitoring device 330 include faster response time and repeatable readings, because the temperature monitoring device 330 is not spaced from the surface to be measured by an air or vacuum gap. This configuration may be particularly useful in low temperature applications (i.e., below 300 degrees Celsius) and may also be beneficial in a temperature control loop.

In another embodiment, shown in FIG. 8B, the temperature monitoring device 330 is spaced-away from walls of the groove 805 such that no contact is provided between walls of the groove 805 and the temperature monitoring device 330. In some embodiments, the spacing provides a thermal well 820 between walls of the groove 805 and the temperature monitoring device 330. The thermal well 820 may introduce an impedance which may be used to damp temperature variations. While the spacing may reduce response time, the thermal well 820 may be advantageous in high temperature applications. Dimensions of the groove 805 may be designed such that the thermal well 820 is substantially isothermal to increase accuracy in temperature readings.

As shown, the locations of the temperature monitoring devices 330 in the grooves 805 (including grooves 340 (FIG. 3) and grooves 535A, 535B (FIG. 5)) may be chosen based on a desired measurement location within the pedestal. The measurement location may be chosen based on desired response time, avoidance of heating element interference, or other reasons. In some embodiments, the end of the temperature monitoring device 330 may be at or near the center in one or more zones. In other embodiments, the end of the temperature monitoring device 330 may be off-center in one or more zones. Precise positioning of a temperature monitoring device 330 within the grooves 805 is uncomplicated using a temperature monitoring device 330 of a specific length when the length of the dielectric insert 320 is known. For example, when the length of a channel within the dielectric insert 320 is known, and the position of the heating element 810 within the pedestal 800 is known, a temperature monitoring device 330 of a desired length can be inserted into the dielectric insert 320 such that an end thereof is positioned at a desired location in the groove 805. In another example, if contact with the wall of the groove 805 is desired, the temperature monitoring device 330 may be made to a length that accounts for the length of a channel within the dielectric insert 320 as well as the length of the groove 805. Embodiments of the pedestals as described herein also eases replacement of the temperature monitoring devices 330 using the dielectric insert 320 such that temperature monitoring devices 330 of varying lengths may be used, if desired, to change the measurement location.

Figure 9A:
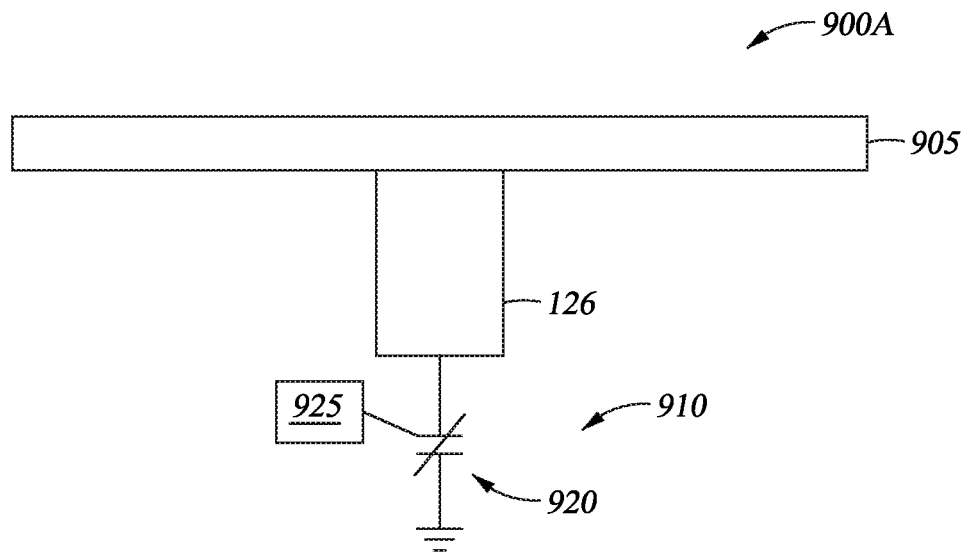
FIGS. 9A and 9B are side views of another embodiment of a pedestal that may be used in the plasma system of FIG. 1.
Figure 9B:
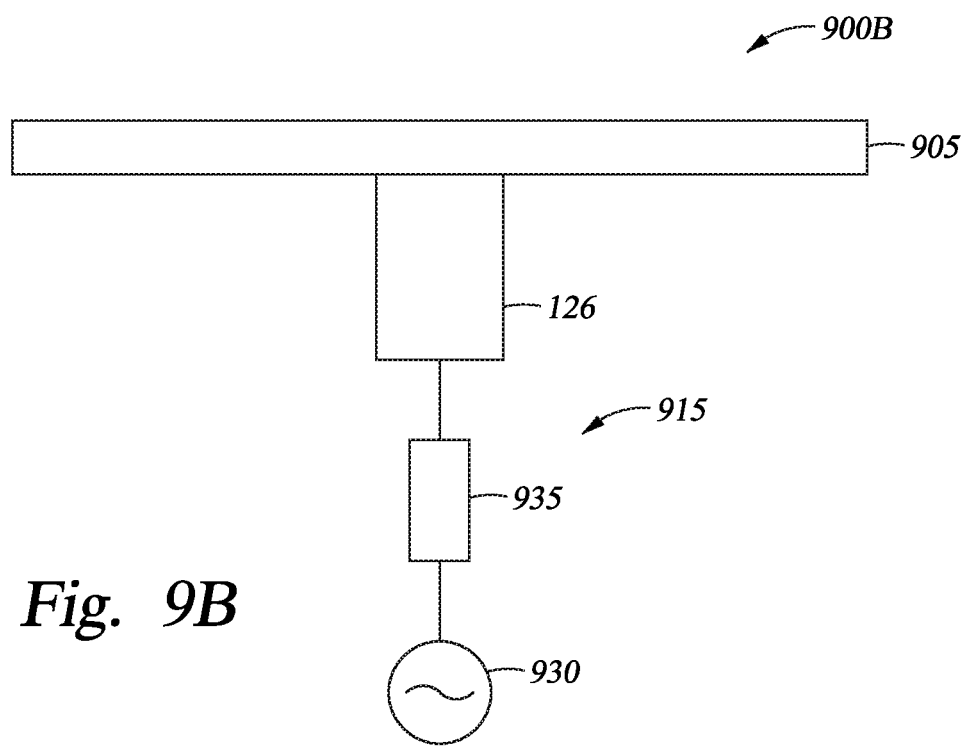

FIGS. 9A and 9B are side views of another embodiment of a pedestal 900A and 900B, respectively that may be used in the plasma system 100 of FIG. 1. Each of the pedestals 900A and 900B comprise a heater 905, which may be a multi-zone heater as described herein. Each of the pedestals 900A and 900B are coupled to a stem 126 that may include a dielectric insert 320 as described in FIGS. 3, 4 and 5.

In the embodiment shown in FIG. 9A, a RF tuning device 910 may be coupled to the heater 905 via a terminal disposed in the dielectric insert 320. The terminal may be coupled to the electrode 310 shown in FIGS. 3 and 5. The RF tuning device 910 may facilitate "bottom tuning" of the pedestal 900A/900B. The RF tuning device 910 may include a tunable capacitor 920, such as a vacuum capacitor. The tunable capacitor 920 may be automatically tuned by an actuator 925, such as a servo motor. In this configuration, RF supplied to the plasma can be varied by adjustment of the tunable capacitor 920, which may enhance film deposition properties on a substrate.

In the embodiment shown in FIG. 9B, a RF device 915 may be coupled to the heater 905 via a terminal disposed in the dielectric insert 320. The terminal may be coupled to the electrode 310 shown in FIGS. 3 and 5. The RF device 915 may facilitate RF bias and/or provide a chucking function to the pedestal 900B. The RF device 915 may include a RF generator 930 and a match circuit 935. The RF device 915 may be used to form a capacitively coupled plasma which may be used to bias a substrate on the heater 905. When the RF device 915 is combined with another RF source in a system, such as the RF source 165 shown and described in FIG. 1, both ion density and ion energy may be tuned, which may enhance film deposition on a substrate. In some embodiment, the RF generator 930 may include a frequency that is different than a frequency of the RF source 165. In some embodiments, the RF devices may be coupled to the electrode 310 to provide an electrostatic chucking function to the pedestal 900B.

Embodiments of a pedestal described herein provide a multi-zone heater that provides more accurate readings as well as a wider range of temperature measurement. Low temperature measurement is also enhanced, which increases the applicability of the heater to low temperature film formation processes.

While the foregoing is directed to embodiments of the disclosure, other and further embodiments of the disclosure may be devised without departing from the basic scope thereof, and the scope thereof is determined by the claims that follow.

What is claimed is:

1. A pedestal for a semiconductor processing chamber, comprising:
   a body comprising a ceramic material;
   a plurality of heater elements encapsulated within the body, wherein each of the plurality of heater elements are separated by a gap; and
   a shaft coupled to the body, the shaft including a plurality of channels formed therein, a portion of the channels having a curved guide portion formed therein that align a respective channel of the plurality of channels to a groove formed in a surface of the body.

2. The pedestal of claim 1, wherein the gap is a lateral gap.

3. The pedestal of claim 1, wherein the gap is a vertical gap.

4. The pedestal of claim 1, wherein the gap includes a thermal break.

5. The pedestal of claim 1, wherein each of the plurality of heater elements are coplanar.

6. The pedestal of claim 1, wherein each of the plurality of heater elements are at different elevations within the body.

7. The pedestal of claim 1, wherein the groove includes a thermal well.

8. The pedestal of claim 1, wherein the groove is bounded on one side by a plate.

9. The pedestal of claim 1, wherein each of the plurality of heater elements form one or more zones in the body.

10. The pedestal of claim 9, wherein the one or more zones are concentric.

11. A pedestal for a semiconductor processing chamber, comprising:
    a body comprising a ceramic material;
    a plurality of heater elements encapsulated within the body, wherein each of the plurality of heater elements are separated by a gap; and
    a hollow shaft coupled to the body, the hollow shaft having a plurality of channels formed therein, wherein at least a portion of the channels comprise a curved guide portion having an end terminating at a groove formed in the body.

12. The pedestal of claim 11, wherein the gap is a lateral gap.

13. The pedestal of claim 11, wherein the gap is a vertical gap.

14. The pedestal of claim 11, wherein the gap includes a thermal break.

15. The pedestal of claim 11, wherein each of the plurality of heater elements are coplanar.

16. The pedestal of claim 11, wherein each of the plurality of heater elements are at different elevations within the body.

17. The pedestal of claim 11, wherein the groove includes a thermal well.

18. The pedestal of claim 11, wherein the groove is bounded on one side by a plate.

19. A pedestal for a semiconductor processing chamber, comprising:
    a body comprising a ceramic material;
    a plurality of heater elements encapsulated within the body forming one or more zones in the body, wherein each of the plurality of heater elements are separated by a gap; and
    a hollow shaft coupled to the body, the hollow shaft having a plurality of channels formed therein, wherein at least a portion of the channels comprise a curved guide portion having an end terminating at a groove formed in the body.

20. The pedestal of claim 19, wherein each of the plurality of heater elements are at different elevations within the body.

21. A pedestal for a semiconductor processing chamber, comprising:
    a body comprising a ceramic material;
    a plurality of heater elements encapsulated within the body, wherein each of the plurality of heater elements are separated by a vertical gap; and
    a shaft coupled to the body, the shaft having a plurality of channels formed therein and one or more guide portions that align a respective channel of the plurality of channels to a groove formed in a surface of the body.

22. A pedestal for a semiconductor processing chamber, comprising:
    a body comprising a ceramic material;
    a plurality of heater elements encapsulated within the body, wherein each of the plurality of heater elements are separated by a gap and are at different elevations within the body; and
    a shaft coupled to the body, the shaft having a plurality of channels formed therein and one or more guide portions that align a respective channel of the plurality of channels to a groove formed in a surface of the body.

* * * * *